United States Patent [19]
Matsuo et al.

[11] Patent Number: 5,312,769
[45] Date of Patent: May 17, 1994

[54] METHOD OF MAKING A SEMICONDUCTOR MEMORY DEVICE

[76] Inventors: Naoto Matsuo, 1-6-18, Mitsukeyama, Ibaraki-shi, Osaka; Shouzou Okada, 2-4-20, Fukaehon-machi, Higashinada-ku, Kobe-shi, Hyogo-ken, both of Japan

[21] Appl. No.: 47,110

[22] Filed: Apr. 13, 1993

Related U.S. Application Data

[62] Division of Ser. No. 792,347, Nov. 14, 1991.

[30] Foreign Application Priority Data

Nov. 15, 1990 [JP] Japan .................................. 2-311034

[51] Int. Cl.⁵ ............................................ H01L 21/70
[52] U.S. Cl. ........................................ 437/52; 437/47; 437/60; 437/89; 437/919
[58] Field of Search ..................... 437/47, 48, 52, 60, 437/89, 919

[56]  References Cited

U.S. PATENT DOCUMENTS 5,045,494  9/1991  Choi et al. ............................ 437/89
5,108,943  4/1992  Sandhu et al. ....................... 437/52
5,128,273  7/1992  Ema ...................................... 437/52

FOREIGN PATENT DOCUMENTS 61-208255  9/1986  Japan .
0149452   6/1989  Japan .
0241857   9/1989  Japan .................................... 437/52
0219264   8/1990  Japan .................................... 437/52
0281655  11/1990  Japan .................................... 437/52

OTHER PUBLICATIONS

A. Sudo et al., "Buried Bit Line (BBL) cell Process Technology for High Density DRAMs", with English translation.

Primary Examiner—Tom Thomas
Attorney, Agent, or Firm—Ratnor & Prestia

[57]  ABSTRACT

A semiconductor memory device in which a storage electrode of a storage capacitor of a memory cell is formed by a selective chemical vapor deposition (CVD) technique. A lithography process is not required when forming the storage electrode. There is no narrowing of the storage electrode pattern and the minimum distance between adjacent storage electrodes can be made smaller than the minimum wiring dimension. The storage capacitance of the semiconductor memory device can be increased and a high storage capacitance is obtained.

2 Claims, 10 Drawing Sheets

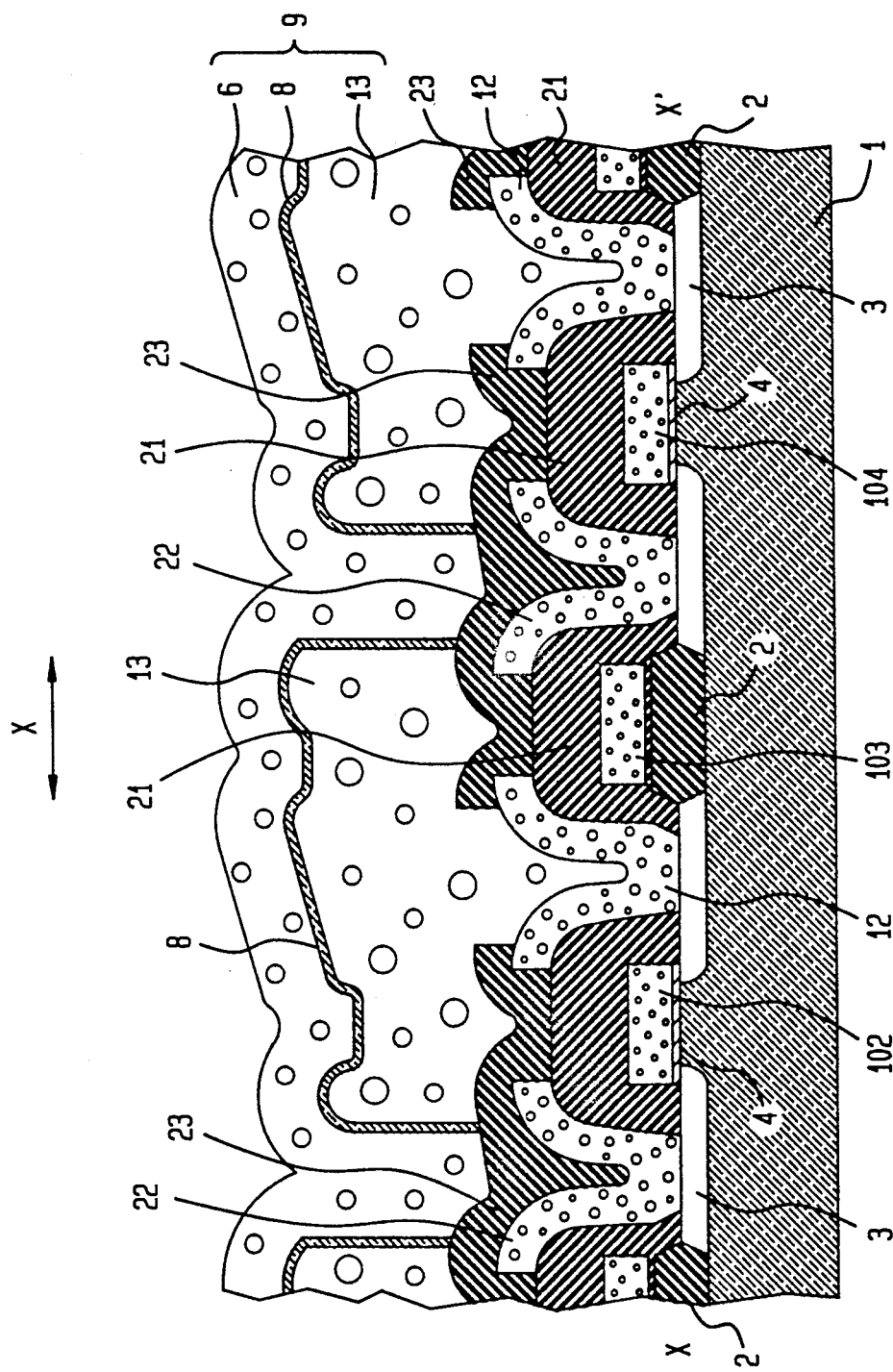

METHOD OF MAKING A SEMICONDUCTOR MEMORY DEVICE

This application is a division of application Ser. No. 07/792,347, filed Nov. 14, 1991.

BACKGROUND OF THE INVENTION

1. Field of the Invention

The present invention relates to a semiconductor memory device and more particularly to a dynamic random access memory (DRAM) and its production method.

2. Description of the Prior Art

A semiconductor memory device of the prior art is disclosed, for example, in Japanese Laid-Open Patent Publication No. 61-208255.

FIG. 6 shows a memory cell of a prior art semiconductor memory device. The memory cell comprises an access transistor and a storage capacitor which are formed on a p-type silicon substrate 101 with a element isolation region 102. The access transistor comprises n-type diffused regions 103, a gate oxide film 104 formed on the p-type silicon substrate 101, and a gate electrode 105 formed on the gate oxide film 104. The storage capacitor 109 comprises a cell plate 106 formed over the p-type silicon substrate 101, a dielectric film 108 formed on the cell plate 106, a storage node 107 formed on the dielectric film 108 and connected to one of the n-type diffused regions 103. The storage node (storage electrode) 107 is formed by deposition of a conductive film and patterning the conductive film into the storage node by lithography and etching steps.

In the prior art semiconductor memory device, as the device elements becomes smaller, the lateral dimension L of the storage node 107 becomes smaller (distance between wiring patterns also decreases). However, to obtain a capacitance greater than some prescribed value, the storage capacitor 109 must have a larger surface area than some prescribed value. Therefore, to increase the surface area of the storage node 107, the height T of the storage node 107 should become larger. An increase in the height T of the storage node 107 results in an increase in the etching time in the dry etching process for patterning the storage node 107. This causes a narrowing effect of the pattern of the storage node 107. Further, as the lateral dimension L of the storage node 107 becomes smaller, an optical interference between adjacent cells occurs in the lithography process. This interference also has a narrowing effect of the pattern of the storage node 107. As described above, in the prior art semiconductor memory devices, it was difficult to form a large number of storage nodes 107 each having a large surface area.

SUMMARY OF THE INVENTION

The semiconductor memory device of this invention, which overcomes the above-discussed and numerous other disadvantages and deficiencies of the prior art, comprises a plurality of memory cells arranged in an array of rows and columns and interconnected by word and bit lines, each of said memory cells comprising: an access transistor having a gate electrode that constitutes a portion of one of said word lines; a polycrystalline silicon lead pad electrically connected to said access transistor; and a storage capacitor including a storage electrode formed on said polycrystalline silicon lead pad and electrically connected to said polycrystalline silicon lead pad, a dielectric film formed on said storage electrode and a plate electrode formed on said dielectric film; wherein a minimum distance between said storage electrode and a storage electrode of an adjacent one of said memory cells is shorter than the width of each of said bit lines, said minimum distance being along said word lines.

In a preferred embodiment, a first distance between said storage electrode and that of an adjacent one of said memory cells is shorter than a second distance of said word lines, said first and second distances being along said bit lines.

According to the invention, a method of fabricating a semiconductor memory device is provided, comprising the steps of: forming transistors on a semiconductor substrate; forming polycrystalline silicon lead pads on said semiconductor substrate, each of said polycrystalline silicon lead pads electrically connected to said transistors; forming a first interlayer insulating film over said transistors and said polycrystalline silicon lead pads; forming bit lines electrically connected to said transistors; forming a second interlayer insulating film on said bit lines; forming contact holes in said first interlayer insulating film, for exposing surfaces of said polycrystalline silicon lead pads; selectively growing polycrystalline silicon films on said surfaces of said first polycrystalline silicon lead pads, and laterally growing upper portions of said polycrystalline silicon films, by a selective chemical vapor deposition technique, thereby forming storage electrodes; forming dielectric films on said storage electrodes; and forming plate electrodes on said dielectric films.

According to the invention, a method of fabricating a semiconductor memory device is provided, comprising the steps of: forming transistors on a semiconductor substrate; forming polycrystalline silicon lead pads on said semiconductor substrate, each of said polycrystalline silicon lead pads electrically connected to said transistors; forming a first interlayer insulating film over said transistors and said polycrystalline silicon lead pads; forming bit lines electrically connected to said transistors; forming a second interlayer insulating film on said bit lines; forming contact holes in said first interlayer insulating film, for exposing surfaces of said polycrystalline silicon lead pads; selectively growing first polycrystalline silicon films on said surfaces of said first polycrystalline silicon lead pads, and laterally growing upper portions of said polycrystalline silicon films, by a selective chemical vapor deposition technique, thereby forming lower portions of storage electrodes; forming oxide films on top and side surfaces of said lower portions of said storage electrodes; anisotropically etching said oxide films, for leaving portions of said oxide films on said side surfaces of said storage electrodes; selectively growing second polycrystalline silicon films on said top surfaces of said first polycrystalline silicon films by a selective chemical vapor deposition technique, thereby forming upper portions of said storage electrodes; removing said portions of said oxide films; forming dielectric films on said storage electrodes; and forming plate electrodes on said dielectric films.

According to the invention, a method of fabricating a semiconductor memory device is provided, comprising the steps of: forming transistors on a semiconductor substrate; forming polycrystalline silicon lead pads on said semiconductor substrate, each of said polycrystalline silicon lead pads electrically connected to said transistors; forming a first interlayer insulating film over said transistors and said polycrystalline silicon lead pads; forming bit lines electrically connected to said transistors; forming a second interlayer insulating film on said bit lines; forming contact holes in said first interlayer insulating film, for exposing surfaces of said polycrystalline silicon lead pads; selectively growing polycrystalline silicon films on said surfaces of said first polycrystalline silicon lead pads, and laterally growing upper portions of said polycrystalline silicon films, by a selective chemical vapor deposition technique, thereby forming storage electrodes; etching surface portions of said second interlayer insulating film, by using said storage electrodes as an etching mask; forming dielectric films on said storage electrodes; and forming plate electrodes on said dielectric films.

Thus, the invention described herein makes possible the objective of providing a semiconductor memory device having a large storage capacitance and its production method in which the pattern of a storage node does not become narrower as the device dimensions are reduced.

BRIEF DESCRIPTION OF THE DRAWINGS

This invention may be better understood and its numerous objects and advantages will become apparent to those skilled in the art by reference to the accompanying drawings as follows:

FIGS. 2B through 2E are cross sections along the lines X—X', W—W', Y—Y' and Z—Z' in FIG. 2A;

DESCRIPTION OF THE PREFERRED EMBODIMENTS

Figure 2A:
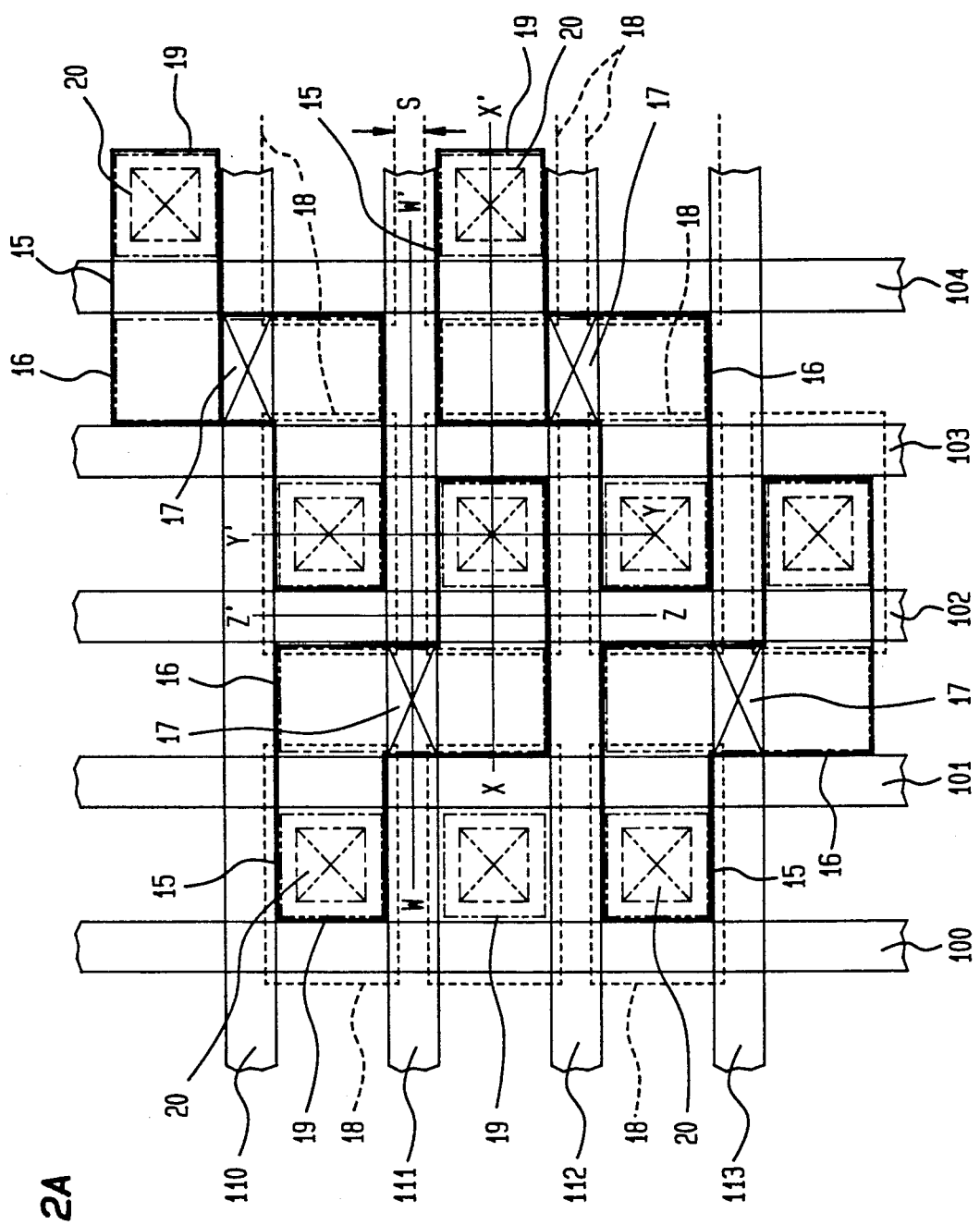
FIG. 2A is a top plan view of the semiconductor memory device of the invention.

FIG. 2A shows an example of a planer layout of a semiconductor memory device of the invention. FIGS. 2B through 2E show cross-sections along the lines X—X', W—W', Y—Y' and Z—Z' in FIG. 2A.

Referring to FIG. 2A, the semiconductor memory device of the invention comprises a plurality of memory cells arranged in an array of rows and columns and interconnected by word lines 100-104 and bit lines 110-113. In FIG. 2A, each region inside the thick solid line 15 is an active region, each region indicated by the one-dot chain line 19 is a region where a first polycrystalline silicon lead pad (indicated by numeral 12 in FIGS. 2B and 2D) exists, each region indicated by numeral 20 is a contact region for connecting the first polycrystalline silicon lead pad 12 to the active region, each region indicated by the dashed line 18 is a region where a storage electrode (indicated by numeral 13 in FIGS. 2B, 2D and 2E) exists, each region inside the one-dot chain line 16 is a region where a second polycrystalline silicon lead pad (22 in FIGS. 2B and 2C) exists, each region indicated by numeral 17 is a contact region for connecting the bit lines 110-113 to the second polycrystalline silicon lead pad.

Referring FIG. 2B, each of the memory cells comprises an access transistor having a gate electrode that constitutes a portion of one of the word lines 102-104, and a storage capacitor 9 electrically connected to the access transistor. The memory cells are formed at the active region of a p-type silicon substrate 1. Each active region is surrounded by an isolation oxide 2 formed on the silicon substrate 1. The access transistor includes $n^+$-type diffused regions (source/drain) 3 formed in the silicon substrate 1, a gate oxide film 4 formed on the silicon substrate 1. An insulating film 21 is formed around the word lines 102-104. A first interlayer insulating film 23 is formed on the insulating film 21 to cover first and second polycrystalline silicon lead pads 12 and 22. The storage capacitor 9 includes the storage electrode 13 formed on the first polycrystalline silicon lead pad 12 and electrically connected to the first polycrystalline silicon lead pad 12, a dielectric film 8 formed on the storage electrode 13 and a plate electrode 6 formed on the dielectric film 8.

Figure 2C:
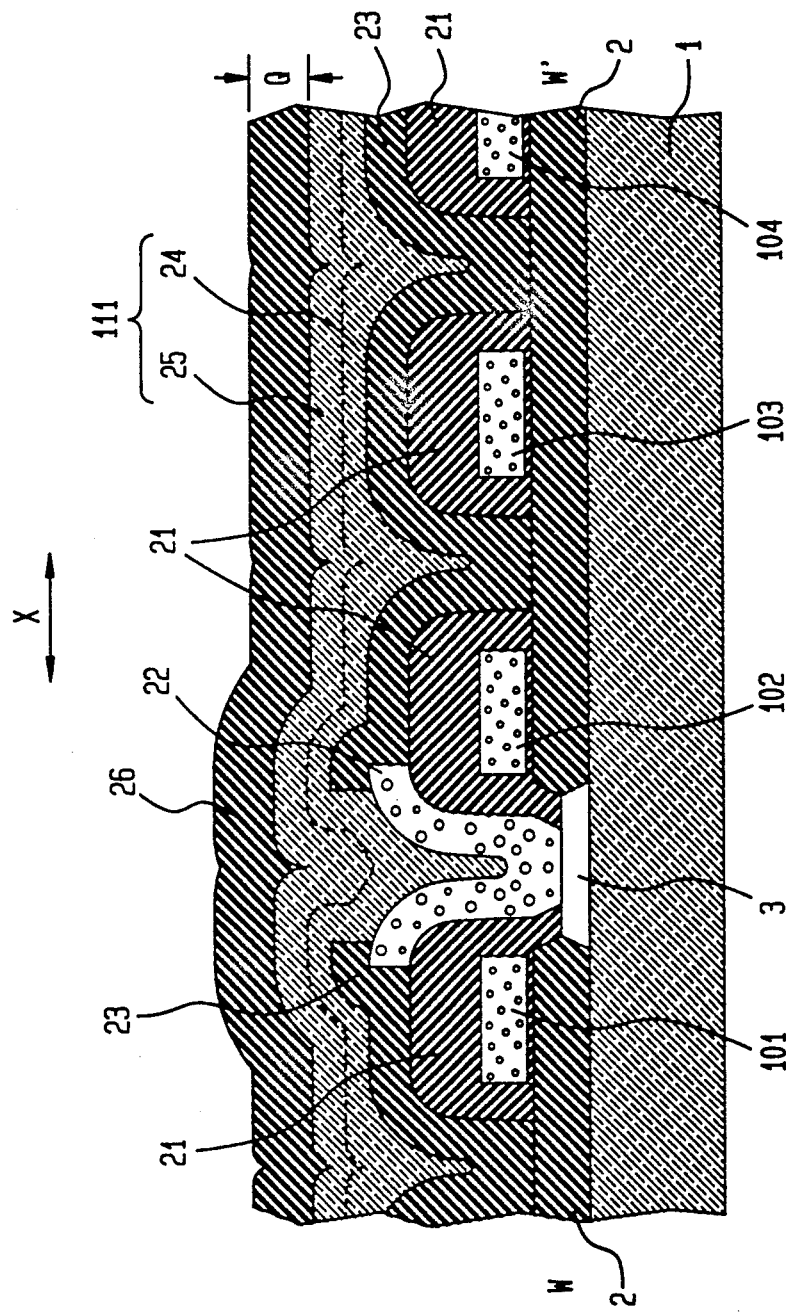
Figure 2D:
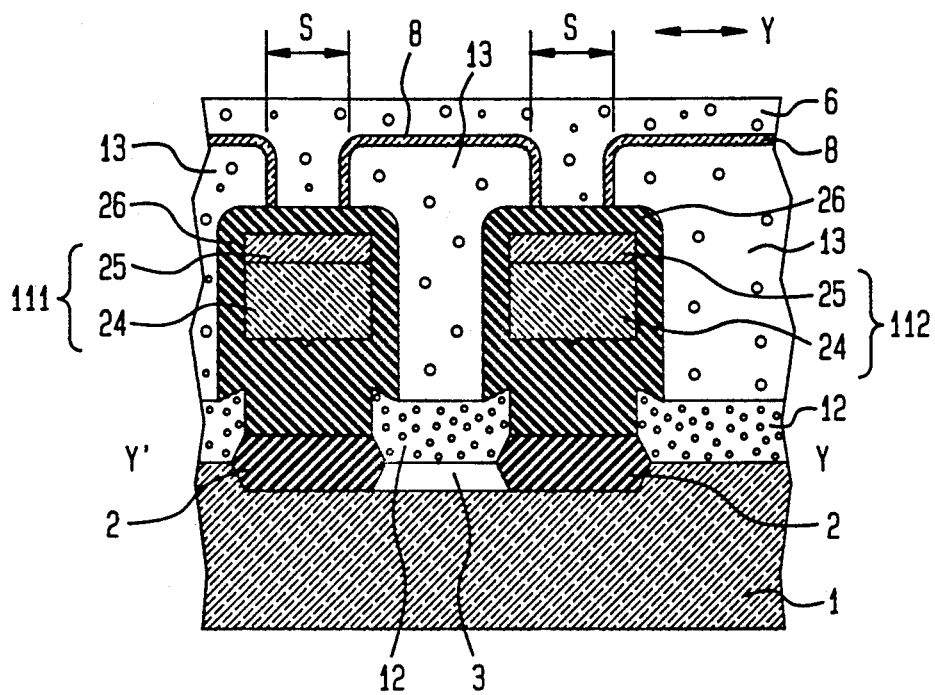
Figure 2E:
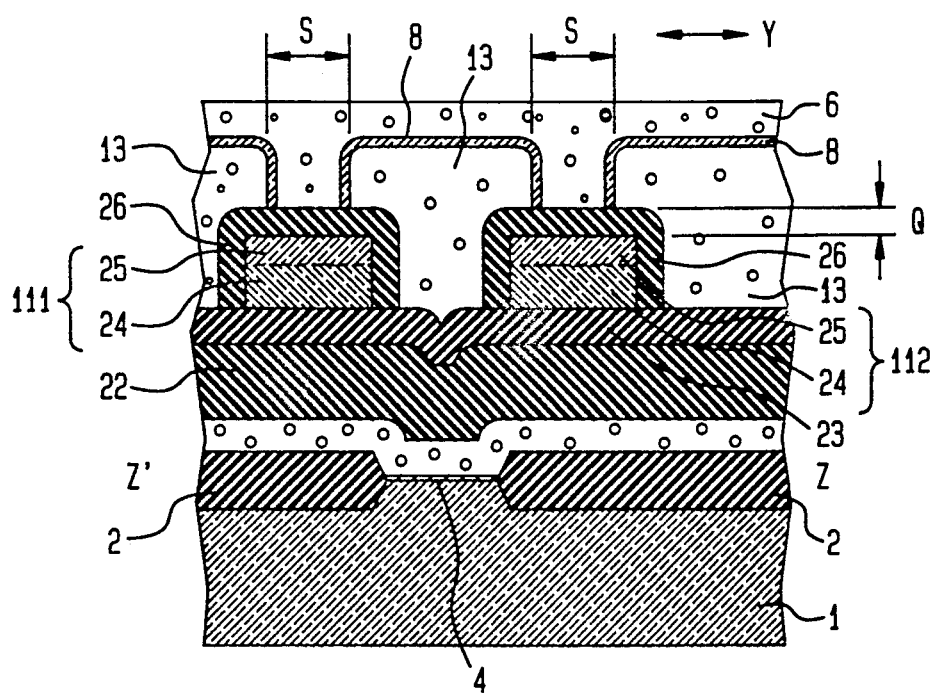

As shown in FIGS. 2C through 2E, the bit line 111 comprises a polycrystalline silicon film 24 of the bottom layer and the tungsten (W) film 25 (which may be tungsten silicide ($WSi_2$) film) of the top layer. Each of the other bit lines 110, 112 and 113 also comprises the polycrystalline silicon film 24 of the bottom layer and the tungsten (W) film 25 of the top layer. A second interlayer insulating film 26 is formed on the bit lines 111 and 112.

As shown in FIG. 2B, the upper portion of each storage electrode 13 extends above the word lines 102-104 adjacent to either side of each polycrystalline silicon lead pad 12, in the lengthwise direction X of the bit lines 110-113. Further, as shown in FIGS. 2D and 2E, the upper portion of the storage electrode 13 extends above the bit lines 111 and 112 adjacent to either side of the polycrystalline silicon lead pad 12, in the lengthwise direction Y of the word lines 100-104.

In the semiconductor memory device of the invention; as shown in FIG. 2A, a minimum distance S between the storage electrodes is shorter than the width of the bit lines 110-113. The minimum distance S is measured along the word lines 100-104. In this embodiment, the minimum distance S being set at 0.2 $\mu$m, is controlled by changing the film thickness when forming the storage electrodes 13. The minimum distance S can be set at 0.05 $\mu$m to 0.1 $\mu$m.

Figure 1:
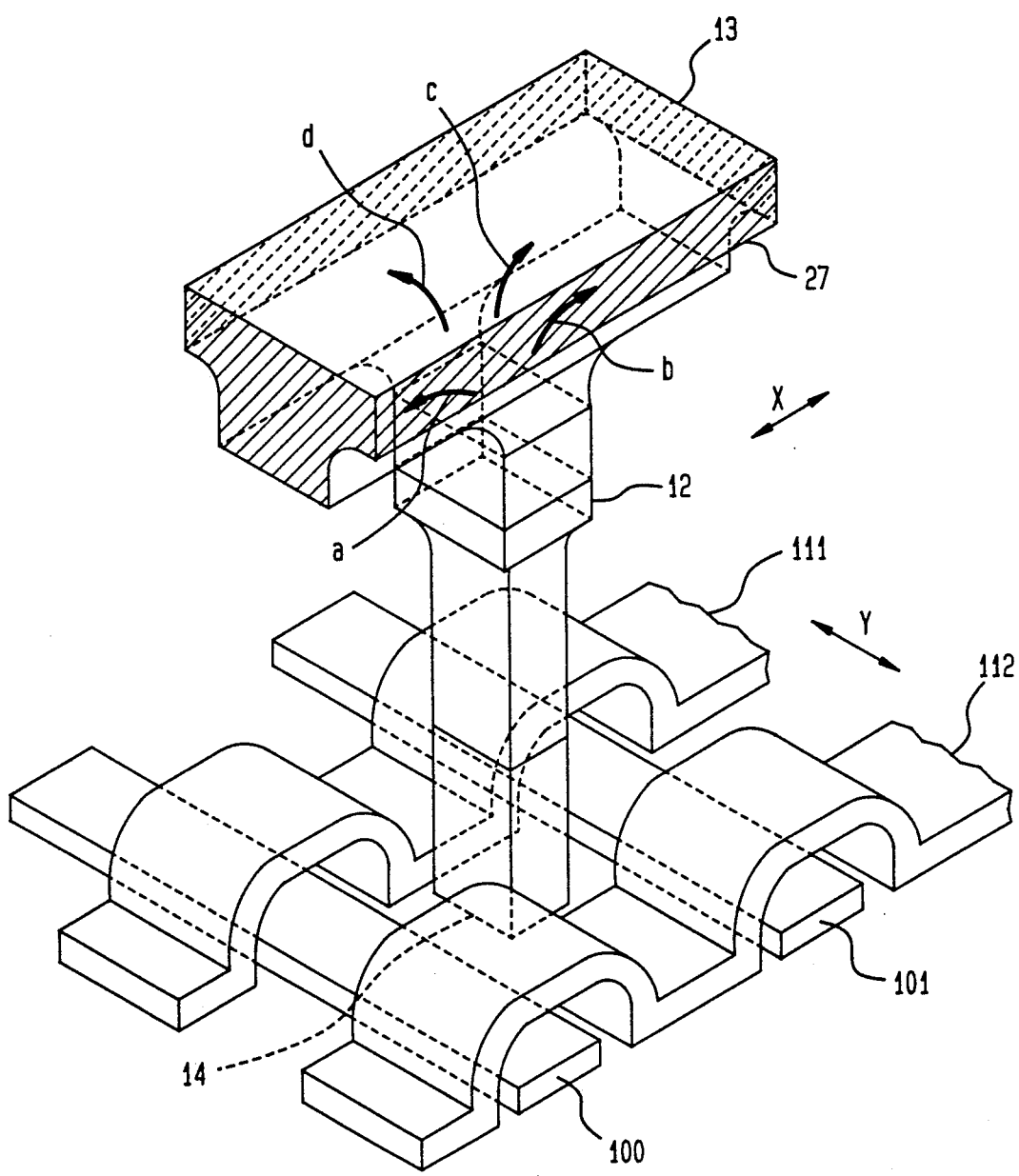
FIG. 1 is a diagram showing a portion of a semiconductor memory device of the invention.

FIG. 1 illustrates the storage electrode 13 of the semiconductor memory device of the invention. In FIG. 1, the directions in which the polycrystalline silicon film (the storage electrode 13) is grown from the top surface of the polycrystalline silicon lead pad 12 is indicated by a, b, c and d. The lengthwise direction of the bit lines 111 and 112 is indicated by X, and the lengthwise direction of the word lines 100 and 101 is indicated by Y.

In the semiconductor memory device of the invention, as shown in FIG. 1, the surface area of the storage electrode 13 is large, and therefore the surface area of the dielectric film 8 (not shown in FIG. 1) formed on this surface can be made large, thus making it possible to increase the storage capacitance.

Referring back to FIG. 2B, operation of the semiconductor memory device of the invention is explained below. The electric carriers are stored in the storage capacitor 9. Further, the information charges are either written to the storage capacitor 9 or read from the storage capacitor 9 via the polycrystalline silicon lead pad 12, the n+-type diffused region 3, a channel region directly beneath the word line 102 (or 104), the first polycrystalline silicon lead pad 22 and the bit line (not shown in FIG. 2B), according to the ON or OFF state of the word line 102 (or 104).

Figure 3A:
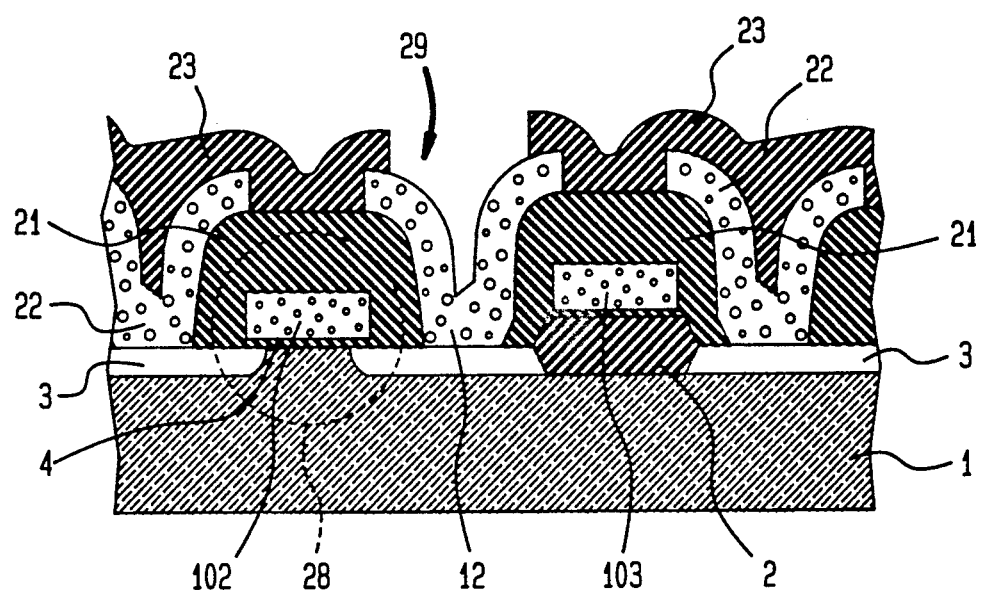
FIGS. 3A through 3C show a sequence of processes in the production method of the semiconductor memory device of the invention.
Figure 3B:
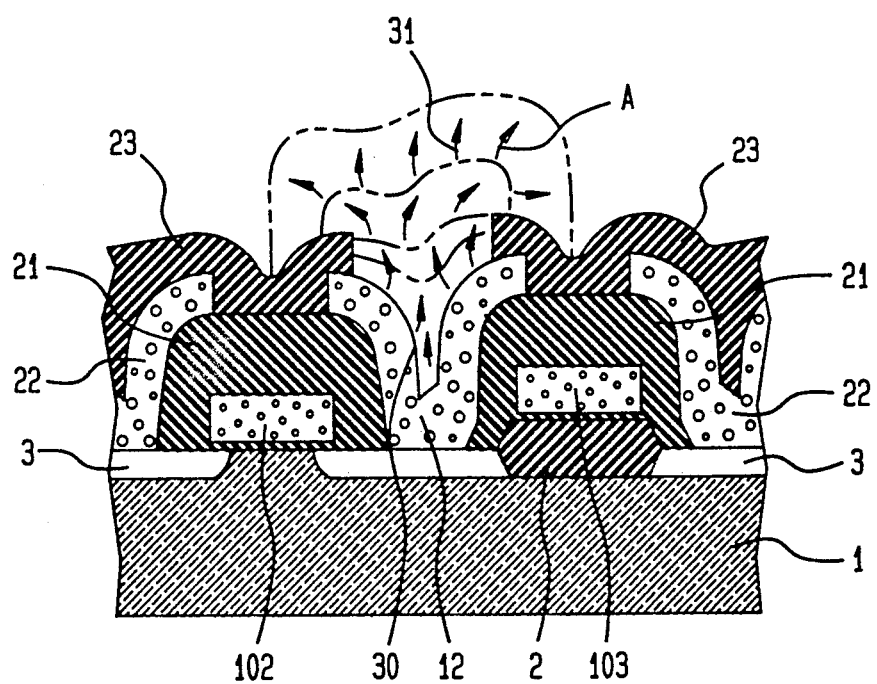
Figure 3C:
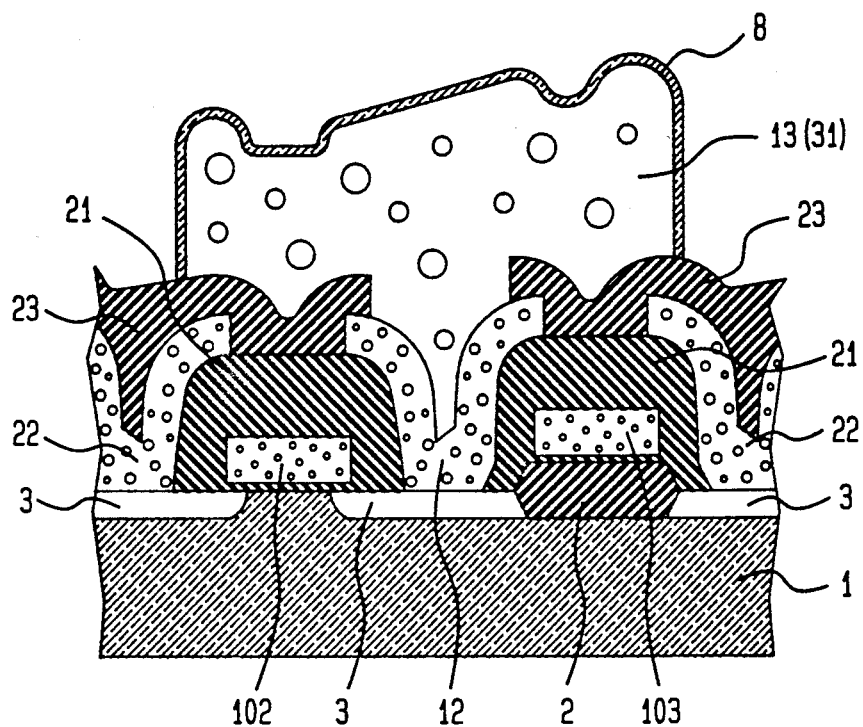

Next is an explanation of a method of fabricating the semiconductor memory device (the first embodiment) of the invention. FIGS. 3A through 3C show a sequence of processes in the production method of the semiconductor memory device. FIGS. 3A through 3C correspond cross sections along the line X—X' in FIG. 2A.

As shown in FIG. 3A, after the field isolation oxide (0.2 μm thick) 2 was formed by a LOCOS technique in a prescribed region on the semiconductor substrate 1, a gate oxide film (10 nm thick) 4, word lines (250 nm thick) 102 and 103, and an oxide film (250 nm thick) 21 were formed over the field isolation oxide 2 and the semiconductor substrate 1, in a known manner. Then, the n+-type diffused regions (source/drain) 3 were formed by implantation of arsenic (As) ions, thereby forming the access transistor 28.

After a polycrystalline silicon film (100 nm thick) was formed over the entire surface of the semiconductor substrate, the polycrystalline silicon film was patterned into the first polycrystalline silicon lead pad 12 and the second polycrystalline silicon lead pad 22 by lithography and dry etching steps.

After forming an oxide film (HTO film) over the entire surface as the first interlayer insulating film 23, contact windows (not shown) were opened in the interlayer insulating film 23, for electrically connecting the second polycrystalline silicon lead pad 22 to one of the bit lines (not shown in FIG. 3A). After a polycide film constituted by a polycrystalline silicon film and a tungsten silicide (WSi$_2$) film was formed on the interlayer insulating film 23, the polycide film was patterned into the bit lines. Next, the second interlayer insulating film (26 in FIG. 5A) was formed on the bit lines. Then, contact windows 29 for electrically connecting the storage electrode (not shown in FIG. 3A) to the first polycrystalline silicon lead pad 12 were formed in the first interlayer insulating film 33 over the first polycrystalline silicon lead pad, by lithography and dry etching steps.

Next, as shown in FIG. 3B, after the surface 30 of the first polycrystalline silicon lead pad 12 was pre-treated at 850° C. for two minutes in a hydrogen atmosphere with a pressure of 20 Torr (may be pretreated at 800°-900° C. for 5 minutes), a polycrystalline silicon film 31 was selectively grown by a selective chemical vapor deposition (CVD) technique in the direction of the arrows A from the surface of the polycrystalline silicon lead pad 12. The growth conditions were as follows: gas: SiH$_2$Cl$_2$+H$_2$+HCl; temperature: 800° C.; and pressure: 20 Torr. The temperature may range from 650° to 800° C. and the pressure from 20 to 100 Torr. By this selective growth technique, the polycrystalline silicon film 31 was grown selectively from the surface of the polycrystalline silicon lead pad 12 to above the word lines 102 and 103 and part of the bit lines (not shown in FIG. 3B). The dashed lines indicate the surface front of the polycrystalline silicon film 31 at the various stages in the selective growth of the polycrystalline silicon film 31.

Next, as shown in FIG. 3C, the storage electrode 13 was formed by stopping the growth of the polycrystalline silicon film 31 at a point where the distance (minimum distance S between the regions 18 where the storage electrodes exist in FIG. 2A) between this polycrystalline silicon film 31 and other adjacent polycrystalline silicon films (not shown in FIG. 3C), which become other storage electrodes, was less than the minimum wiring dimension (e.g., the width of the bit lines 110-113). Following this, an oxide-nitride-oxide (ONO) film (5 nm thick) was formed on the surface of the storage electrode 13 as a dielectric film 8, after which, a polycrystalline silicon film (0.2 μm thick) was deposited on this surface, to form the plate electrode (not shown).

In this first embodiment, the dielectric film 8 was an ONO film and the minimum distance S between adjacent storage electrodes 13 was 0.2 μm, whereby the capacitance became 19 fF, and when the minimum distance S was made 0.1 μm, the capacitance became 22 fF.

Figure 4A:
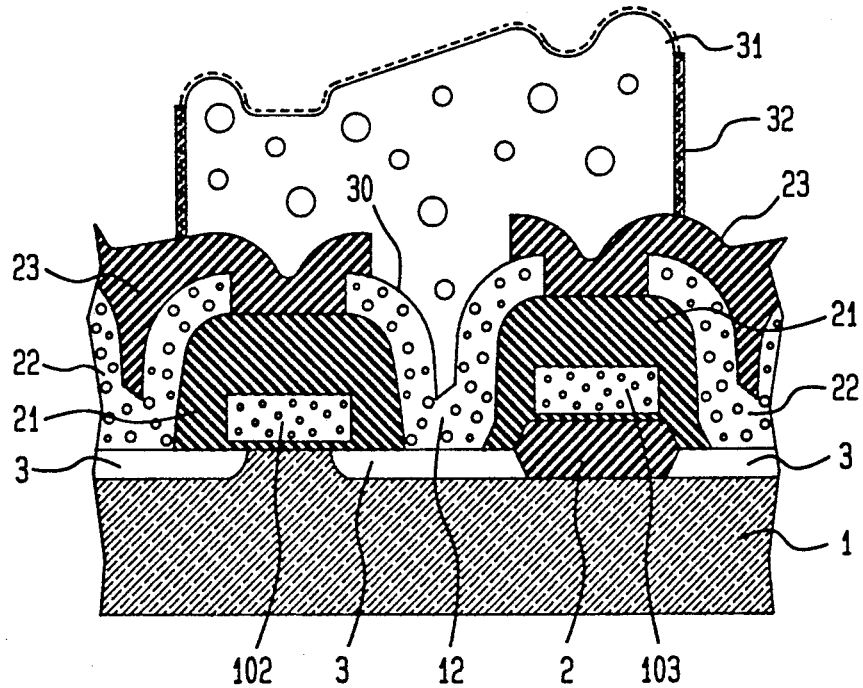
FIGS. 4A through 4C show a sequence of processes in the production method of another semiconductor memory device of the invention
Figure 4B:
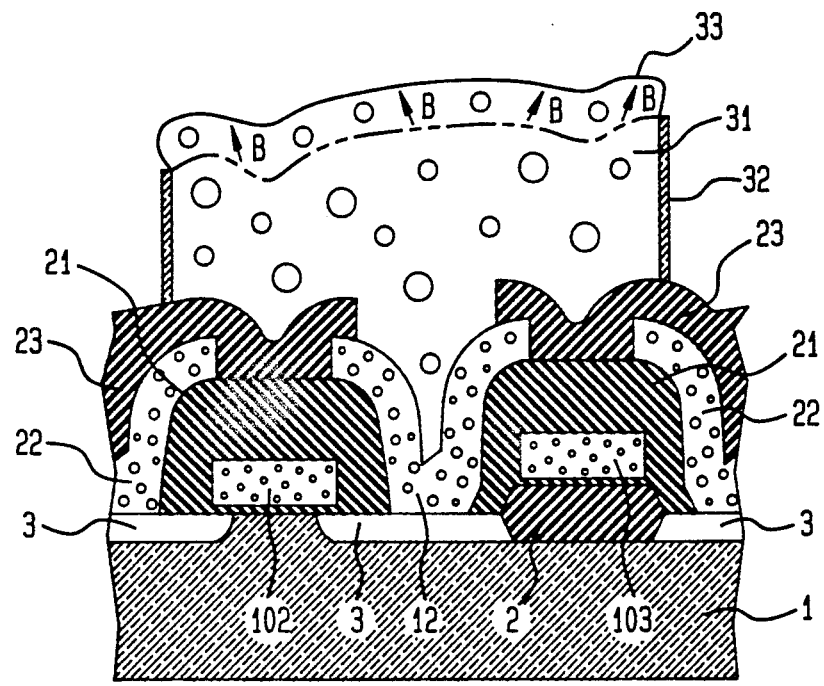
Figure 4C:
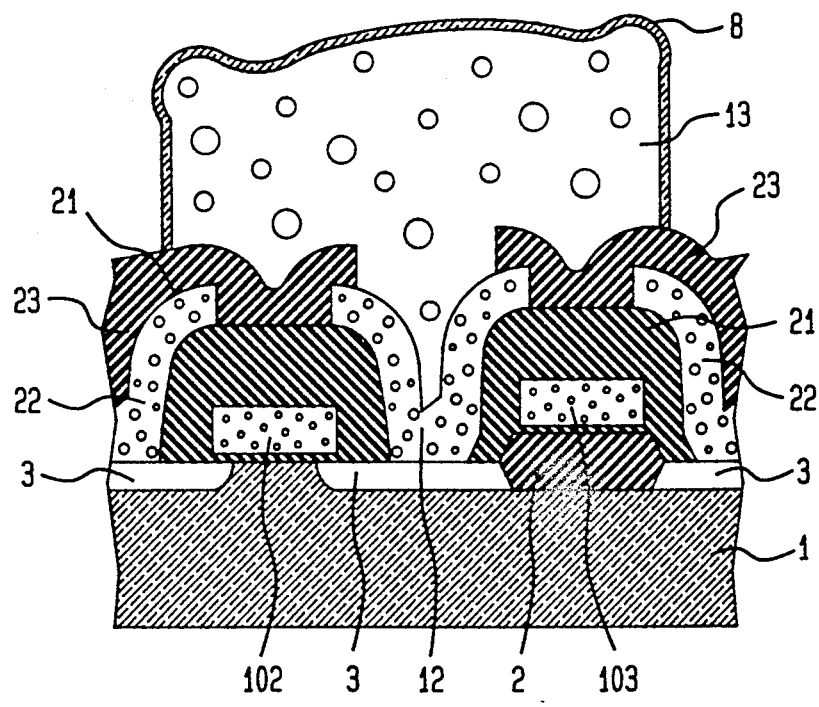

FIGS. 4A through 4C show a sequence of processes in the production method of a second embodiment of the invention. FIGS. 4A through 4C correspond to the cross sections along the line X—X' in FIG. 2A.

After the surface 30 of the first polycrystalline silicon lead pad 12 was pre-treated under the same conditions as those in the processes for the first embodiment, the polycrystalline silicon film (the first polycrystalline silicon film) 31 was selectively grown on the surface 30 of the polycrystalline silicon lead pad 12, and this growth was stopped at a point where the distance between adjacent polycrystalline silicon films was less than the minimum wiring dimension.

Further, an oxide film (10 nm thick) 32 was formed on the top and side surfaces of the first polycrystalline silicon film 31 by thermal oxidation. Then, the oxide film 32 on the top surface of the first polycrystalline silicon film 31 was removed by anisotropic etching, and only the oxide film 32 on the side surface of the first polycrystalline silicon film 31 was left.

Next, as shown in FIG. 4B, a second polycrystalline silicon film (0.2 μm thick) 33 was selectively grown on the exposed top surface of the first polycrystalline silicon film 31 using the same selective chemical vapor deposition (CVD) technique as used in the step of forming the first polycrystalline silicon film 31, thereby forming the storage electrode 13. The growth conditions for the second polycrystalline silicon film 33 were as follows: gas: SiH$_2$Cl$_2$+H$_2$+HCl; temperature: 800° C.; and pressure: 20 Torr. The temperature may range from 650° to 800° C. and the pressure from 20 to 100 Torr. The second polycrystalline silicon film 33 was grown in the direction of the arrows B.

After the oxide film 32 on the side surface of the storage electrode 13 was removed by wet etching, a dielectric film 8 was formed on the top and side surfaces of the storage electrode 13, as shown in FIG. 4C. An oxide-nitride-oxide (ONO) film (5 nm thick) was used as the dielectric film 8. Following this, the plate electrode (not shown) was formed in the same manner as in the first embodiment.

In the second embodiment, the thickness of the second polycrystalline silicon film 33 was 0.1 μm and the minimum distance S between adjacent storage electrodes 13 was 0.2 μm, whereby the capacitance was 22 fF, and when the minimum distance S was made 0.1 μm, the capacitance became 26 fF.

Figure 5A:
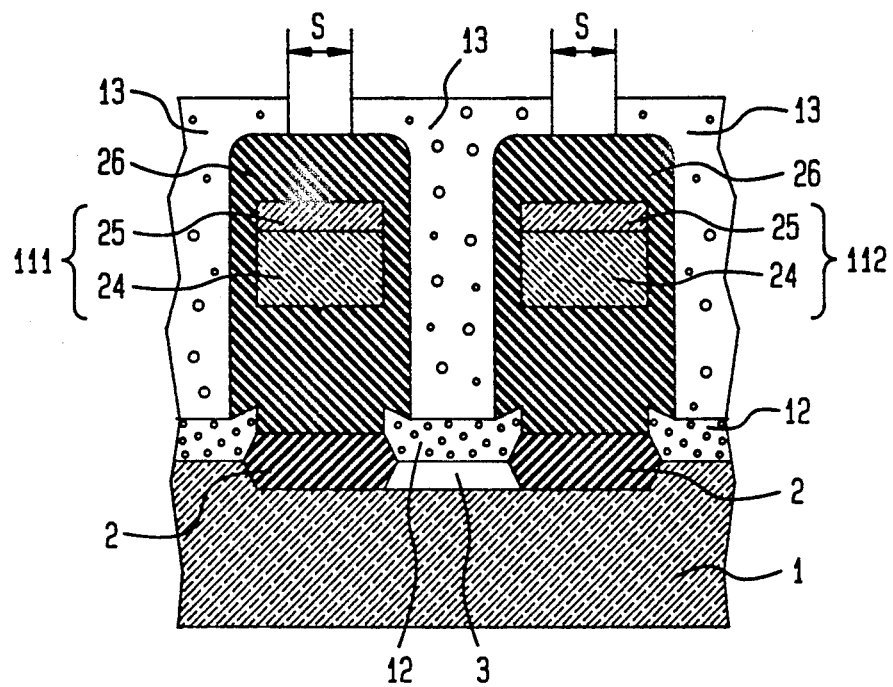
FIGS. 5A and 5B show a sequence of processes in the production method of a further semiconductor memory device of the invention.
Figure 5B:
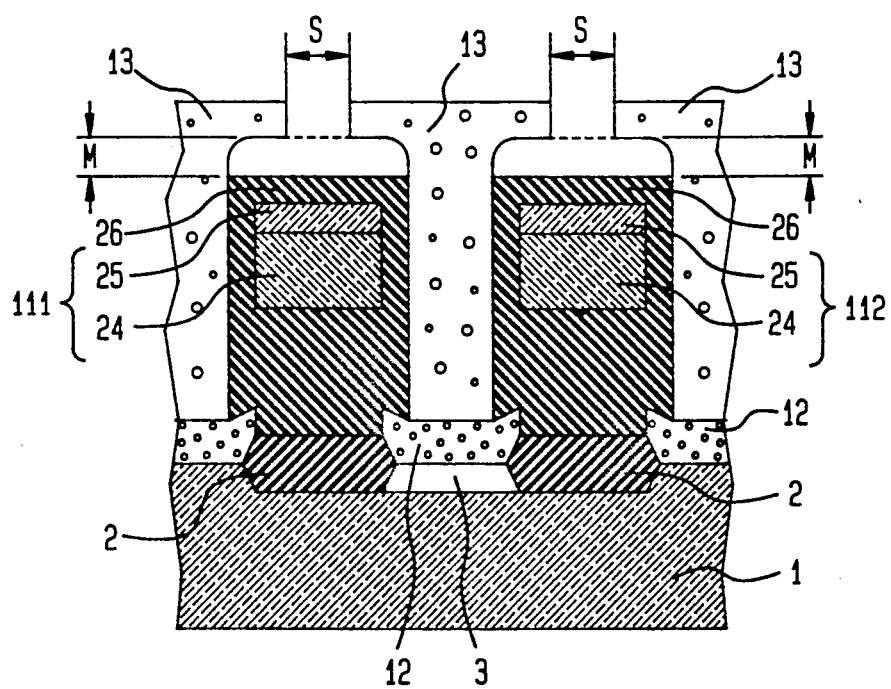
Figure 6:
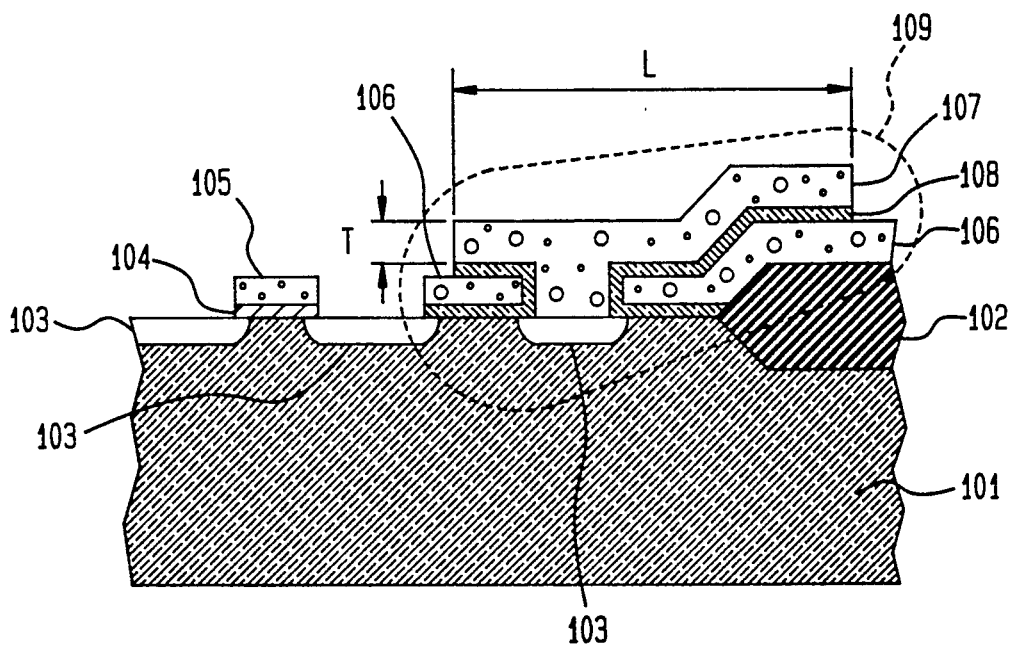
FIG. 6 is a cross section of a prior art semiconductor memory device.
Figure 2A:
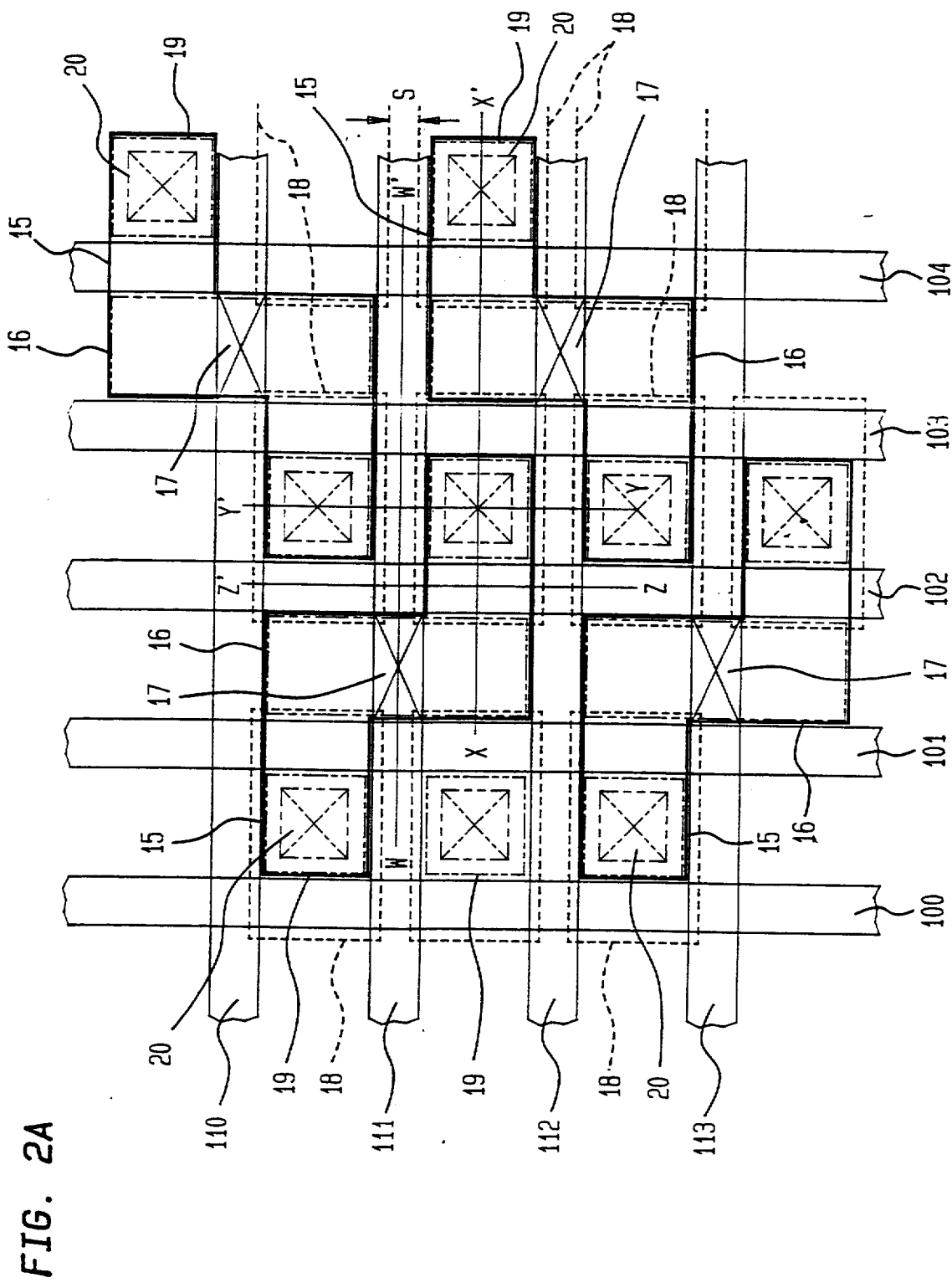

FIGS. 5A and 5B show a sequence of processes in the production method of a third embodiment of the invention. FIGS. 5A and 5B correspond to the cross sections along the line Y—Y' in FIG. 2A.

As shown in FIG. 5A, the storage electrode 13 was formed by the same processes as in the first embodiment. In the processes, the thickness of the second interlayer insulating film 26 was initially set to be 0.3 μm.

Next, as shown in FIG. 5B, surface portions of the second interlayer insulating film 26 (the thickness of the surface portions was 0.2 μm) were removed by wet etching. This etching step resulted in that the surface area of the exposed side surface (27 in FIG. 1) of the storage electrode 13 was increased. Following this, the dielectric film (not shown) and the plate electrode (not shown) were formed.

In the third embodiment, a surface area of the storage node (capacitance: 26 fF) larger than that of the storage node of the first embodiment was obtained.

Although the oxide-nitride-oxide (ONO) film was used as the dielectric film 8 in the first, second and third embodiments, a tantalum pentoxide ($Ta_2O_5$) film having a high dielectric constant may be used. As described above, in the embodiments, the storage electrode 13 was formed precisely (S: 0.05-0.1 μm) by a self-aligned process using a selective growth technique. The difference in height between the storage electrode 13 and the surrounding region was extremely small (about 0.1 μm).

According to the invention, the storage electrode is formed by a selective chemical vapor deposition (CVD) technique. Therefore, there is no narrowing of the storage electrode pattern and the minimum distance between adjacent storage electrodes can be made smaller than the minimum wiring dimension, without being limited by resolution of a lithography process. As a result, the storage capacitance of the semiconductor memory device can be increased and a high storage capacitance is obtained. Further, since a lithography process is not required when forming the storage electrode, production yield is increased and costs are reduced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a semiconductor memory device comprising the steps of:

forming transistors on a semiconductor substrate;

forming polycrystalline silicon lead pads on said semiconductor substrate, each of said polycrystalline silicon lead pads electrically connected to said transistors;

forming a first interlayer insulating film over said transistors and said polycrystalline silicon lead pads;

forming bit lines electrically connected to said transistors;

forming a second interlayer insulating film on said bit lines;

forming contact holes in said first interlayer insulating film, for exposing surfaces of said polycrystalline silicon lead pads;

selectively growing first polycrystalline silicon films on said surfaces of said first polycrystalline silicon lead pads, and laterally growing upper portions of said polycrystalline silicon films, by a selective chemical vapor deposition technique, thereby forming lower portions of storage electrodes;

forming oxide films on top and side surfaces of said lower portions of said storage electrodes;

anisotropically etching said oxide films, for leaving portions of said oxide films on said side surfaces of said storage electrodes;

selectively growing second polycrystalline silicon films on said top surfaces of said first polycrystalline silicon films by a selective chemical vapor deposition technique, thereby forming upper portions of said storage electrodes;

removing said portions of said oxide films;

forming dielectric films on said storage electrodes; and forming plate electrodes on said dielectric films.

2. A method of fabricating a semiconductor memory device according to claim 1, wherein said selective growth of at least one of said first and second polycrystalline silicon films is performed at a temperature from 650° C. to 800° C.

* * * * *

UNITED STATES PATENT AND TRADEMARK OFFICE
CERTIFICATE OF CORRECTION

PATENT NO.   : 5,312,769
DATED        : May 17, 1994
INVENTOR(S)  : Matsuo et al.

It is certified that error appears in the above-identified patent and that said Letters Patent is hereby corrected as shown below:

IN THE DRAWINGS:

Please replace sheet 2 of 10, Figure 2A of the Letters Patent with sheet 2 of 10, Figure 2A, attached herewith.

Signed and Sealed this

Fourth Day of July, 1995

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,312,769
DATED : May 17, 1994
INVENTOR(S) : Matsuo et al.

It is certified that error appears in the above-indentified patent and that said Letters Patent is hereby corrected as shown below:

Cover Page, left column, before "[21] Appl. No.", insert
--[73] Assignee: Matsushita Electric Industrial Co., Ltd., Osaka, Japan--.

Signed and Sealed this

Eighteenth Day of July, 1995

Attest:

BRUCE LEHMAN

*Attesting Officer*       Commissioner of Patents and Trademarks